(12) United States Patent
Jhung

(10) Patent No.: US 7,579,926 B2
(45) Date of Patent: Aug. 25, 2009

(54) FBAR BAND PASS FILTER, DUPLEXER HAVING THE FILTER AND METHODS FOR MANUFACTURING THE SAME

(75) Inventor: Jaemyoung Jhung, Seoul (KR)

(73) Assignee: Mems Solutions Inc., Gyeonggi-do (KR)

( * ) Notice: Subject to any disclaimer, the term of this patent is extended or adjusted under 35 U.S.C. 154(b) by 291 days.

(21) Appl. No.: 10/545,613

(22) PCT Filed: Feb. 21, 2004

(86) PCT No.: PCT/KR2004/000362

§ 371 (c)(1),
(2), (4) Date: Aug. 16, 2005

(87) PCT Pub. No.: WO2004/075402

PCT Pub. Date: Sep. 2, 2004

(65) Prior Publication Data

US 2006/0139121 A1    Jun. 29, 2006

(30) Foreign Application Priority Data

Feb. 22, 2003    (KR) .................. 10-2003-0011180

(51) Int. Cl.
*H03H 9/54*    (2006.01)
*H03H 9/70*    (2006.01)

(52) U.S. Cl. ...................... 333/133; 333/189

(58) Field of Classification Search .......... 333/187, 333/189, 133

See application file for complete search history.

(56) References Cited

U.S. PATENT DOCUMENTS 5,194,836 A * 3/1993 Vale et al. .............. 333/133

(Continued)

FOREIGN PATENT DOCUMENTS

KR    1020020037070    5/2002
WO    WO 02/093763    * 11/2002

OTHER PUBLICATIONS

J. Rosenbaum et al., "Design and Fabrication of Two-Pole Monolithic Bulk Acoustic Filters", IEEE 1990 Microwave and Millimeter-Wave Monolithic Circuits Symposium, May 7-8, 1990, pp. 63-66.*
C.W. Seabury et al., "thin Film ZnO Based Bulk Acoustic Mode Filters", IEEE 1997 Microwave Symposium Digest, Jun. 8-13, 1997, vol. 1, pp. 181-184.*

*Primary Examiner*—Barbara Summons
(74) *Attorney, Agent, or Firm*—Rabin & Berdo, P.C.

(57) ABSTRACT

A duplexer including an FBAR band pass filter that can be easily embodied in single chip, and a method for manufacturing the same are disclosed. The duplexer of a mobile communication device includes a transmitting band pass filter, formed on an upper portion of a substrate, having at least two FBARs electrically connected to each other, a receiving band pass filter, formed on an other side of the substrate, having at least two FBARs electrically connected to each other, and a page shifter electrically connected with the transmitting band pass filter and the receiving band pass filter. Since the transmitting and receiving band pass filter and the inductor can be integrated into one chip, a duplexer with minimized size can be provided in response to the request of miniaturization and lightness of various mobile communication device. Moreover, since the transmitting or receiving band pass filter according to the present invention can be embodied in a remarkable size in comparison with the conventional SAW band pass filter as well as has a low insertion loss and low power consumption. Thus, an interface design and a terminal operating programming can be easily achieved, and a region of a board with a duplexer is mounted in a mobile communication device can be remarkably reduced.

4 Claims, 15 Drawing Sheets

U.S. PATENT DOCUMENTS

| | | |
|---|---|---|
| 5,789,845 A | 8/1998 | Wadaka et al. |
| 5,872,489 A * | 2/1999 | Chang et al. ................. 331/179 |
| 6,262,637 B1 | 7/2001 | Bradley et al. |
| 6,297,580 B1 | 10/2001 | Takayama et al. |
| 6,313,715 B1 | 11/2001 | Bergmann et al. |
| 6,407,649 B1 | 6/2002 | Tikka et al. |
| 6,472,954 B1 * | 10/2002 | Ruby et al. ................. 333/133 |
| 6,486,751 B1 | 11/2002 | Barber et al. |
| 6,509,813 B2 | 1/2003 | Ella et al. |
| 6,559,737 B1 * | 5/2003 | Nagra et al. ................. 333/156 |
| 6,710,681 B2 * | 3/2004 | Figueredo et al. ........... 333/187 |
| 6,768,396 B2 * | 7/2004 | Klee et al. ................... 333/187 |
| 6,885,260 B2 * | 4/2005 | Nishimura et al. ........... 333/133 |
| 6,911,708 B2 * | 6/2005 | Park ............................ 257/416 |
| 6,927,649 B2 * | 8/2005 | Metzger et al. .............. 333/133 |
| 7,057,477 B2 * | 6/2006 | Wang .......................... 333/189 |
| 7,084,718 B2 * | 8/2006 | Nakamura et al. ........... 333/133 |
| 2003/0205948 A1 * | 11/2003 | Lin et al. ..................... 310/312 |

* cited by examiner

FBAR BAND PASS FILTER, DUPLEXER HAVING THE FILTER AND METHODS FOR MANUFACTURING THE SAME

TECHNICAL FIELD

The present invention relates to a film bulk acoustic resonator (hereinafter referring to "FBAR") band pass filter, a duplexer having the FBAR band pass filter and a method for manufacturing the same, and more particularly, to an FBAR band pass filter that can be easily embodied in single chip by applying a micro electro-mechanical system (MEMS) technique, a duplexer having the FBAR band pass filter and a method for manufacturing the same.

BACKGROUND ART

Generally, a duplexer is a device that performs the functions of separating and transmitting a transmitting frequency and a receiving frequency from several radio frequencies of a mobile communication device and selecting only required frequency from a lot of frequencies mixed with noise. The duplexer is connected with a lower side of an antenna of the mobile communication device so that the duplexer separates the transmitting and receiving frequencies, passes only required frequency during the transmission and the reception, and eliminates unnecessary frequencies. Recently, a high performance and small mobile communication device is a general tendency, and additionally, a multi-mode mobile communication device capable of performing a dual band type mobile communication device or a triple band type mobile communication device is rapidly developed. At the present time, as SAW duplexer is generally used according to the light and thin trend.

The SAW duplexer is proposed in U.S. Pat. No. 6,313,715 allowed to Andreas Bergmann et al.

FIG. 1 shows a schematic block diagram of the SAW duplexer disclosed in the U.S. Patent.

Referring FIG. 1, the SAW duplexer 10 includes a transmitting SAW filter 15, a receiving SAW filter 20, a transmitting capacitor 25, and an inductor 35. Though the capacitor 25 is connected to the transmitting SAW filter 15 in serial, the capacitor 25 can be connected to the receiving SAW 20 and the inductor 35 is generally connected to a signal line branched from an antenna 30.

The SAW duplexer 10 described above transmits a signal from a system to antenna 30 through the transmitting SAW filter 15 according to a frequency of the received signal, or performs a function for transmitting the received signal from the antenna 30 to the system through the receiving SAW filter 20.

The transmitting and receiving SAW filters 15 and 20 have a structure formed with single electrode or multiple electrodes on a substrate comprised of piezoelectric materials as disclosed in U.S. Pat. No. 6,297,580 allowed to Ryouichi Takayama et al, and these SAW filters 15 and 20 are widely used because of the smallness and lightness recently.

Presently, a code division multiple access (hereinafter referred to CDMA) terminal, a data card, and the like essentially have a duplexer for separating the transmitting and receiving signals from single antenna. A duplexer utilized in a mobile communication device of a frequency division duplexer (hereinafter referred to FDD) type like the CDMA type terminal includes a SAW band pass filter packaged with a high price ceramic package.

However, if the SAW band pass filter is utilized, the size of the duplexer is essentially increased, so that it is difficult to allocate all components on single chip and this fact becomes an obstacle for the high performance and miniaturization of the mobile communication device in future. For example, a personal communication service (PCS) terminal used in the present time uses a duplexer including two SAW filters having frequency bad about 1860 MHz to 1880 MHz and about 1880 MHz to 1910 MHz. Since, for this, a substrate with an area more than at least about 5×12 mm is required, it becomes an obstacle to miniaturize the mobile communication device.

Moreover, in case of the duplexer adopting the SAW filter, since the size of the chip is increased as well as the ceramic for package is high price, the manufacturing cost of the SAW duplexer is increased. In addition, since even an impedance matching network (IMN) needless of packaging with the ceramic package is packaged together the SAW filter, it is difficult to manufacture the SAW duplexer and the manufacturing cost thereof is increased.

In comparison with this, the FBAR filter can be manufactured in commercial quantity at low cost, and the size of the substrate in which the duplexer including the FBAR filter is formed can be reduced lower than about 3×3 mm. Moreover, since the FBAR filter can be used in a micro-frequency band and has advantages to be used in a PCS frequency band as well as a digital cellular system (DSC) frequency, the duplexer including the FBAR filter is researched and developed now. The FBAR is one to use a principle that if the piezoelectric material applies electrical energy to both electrodes disposed between, en electric field being timely varied within a piezoelectric layer is maintained and a bulk acoustic wave is generated according to the electric field.

FIG. 2 shows a schematic sectional view of a conventional FBAR filter.

By referring FIG. 2, the conventional FBAR filter has a structure of laminating a lower electrode layer 60, a piezoelectric layer 65, and an upper electrode layer 70 on a semiconductor board 55 in turn.

In to the FBAR filter 50, the piezoelectric layer 65 is laminated by sputtering a piezoelectric material such as zinc oxide (ZnO), aluminum nitride (AlN), and the like, then a device with s thin film structure for causing resonance according to the characteristics of the piezoelectric layer 65 is embodied into a filter.

U.S. Pat. No. 6,407,649 allowed to Pasi Tikka et al proposes a duplexer including an FBAR band pass filter.

FIG. 3 shows a sectional view of the duplexer including the FBAR band pass filter disclosed in the U.S. patent.

As shown in FIG. 3, the conventional FBAR duplexer 100 is comprised of a receiving filter 130 and a transmitting filter 135 on a substrate 105. The transmitting and receiving filters 130 and 135 have serial resonators 110 and 115 and shunt resonators 120 and 125, respectively. The serial resonators 110 and 115 and the shunt resonators 120 and 125 include a lower electrode 145, a piezoelectric layer 151, and an upper electrode 155, respectively, and are formed on a lower structure 140 including an inductor and a capacitor: respective shunt resonators 120 and 125 may be additionally formed with shunt tuners 160 on the upper electrode 155, and a transmitting tuning layer 165 may be formed on the upper electrode 155 of the serial resonator 115 and the shunt tuner 160 of the shunt resonator 125 of the transmitting filter 135, additionally.

However, according to the duplexer of the U.S. patent, since a duplexer module is manufactured by manufacturing the transmitting FBAR filter, the receiving. FBAR filter, and the chip type inductor in the form of single device and packaging the same on the substrate, the size of the duplexer module is restricted to decrease. Moreover, since the transmitting and receiving FBAR filters, the inductor, the capacitor, and the like are manufactured separately and then integrated, the more time and higher cost for manufacturing the duplexer are required.

DISCLOSURE OF INVENTION

Accordingly, the present invention is made to overcome the above described problems of the conventional duplexer, and its object is to provide a duplexer with an FBAR band pass filter being manufactured in low cost while being reduced its module size by easily embodying a shifter, an inductor, an FBAR filter, and the like on single substrate.

Other object of the present invention is to provide a method for manufacturing a duplexer, particularly adaptable to a duplexer with an FBAR band pass filter being manufactured in low cost while being reduced its module size by easily embodying a shifter, an inductor, an FBAR filter, and the like on single substrate.

Another object of the present invention is to provide a transmitting FBAR band pass filter or a receiving FBAR band pass filter integrated with an inductor on single substrate or separated from the same.

It is still another object to provide a method for manufacturing a FBAR band pass filter, particularly adaptable to a transmitting FBAR band pass filter or a receiving FBAR band pass filter integrated with an inductor on single substrate or separated from the same.

In order to achieve the object of the present invention, it is provided a duplexer of a mobile communication device including a transmitting band pass filter, formed on an upper portion of a substrate, having at least two FBARs electrically connected to each other, a receiving band pass filter, formed on an other side of the substrate, having at least two FBARs electrically connected to each other, and a phase shifter electrically connected with the transmitting band pass filter and the receiving band pass filter. Each of the FBARs includes a lower electrode, a piezoelectric layer, and an upper electrode, the lower electrode and the upper electrode comprise one selected from a group of aluminum, gold, platinum, tungsten, molybdenum, tantalum, platinum-tantalum, titanium, and platinum-titanium, and the piezoelectric layer comprises one selected from a group of PZT (lead zirconium titanate), PLZT (lanthanum-doped lead zirconium titanate), PMN (magnesium-lead niobate), PMN-PT (lead-magnesium-niobate lead titanate), PZN (lead zinc niobate), PZN-PT (lead zinc niobate-lead titanate), aluminum nitride, and zinc oxide. The phase shifter may include an inductor and a capacitor.

In order to achieve other object of the present invention, the present invention provides a manufacturing method of a duplexer for a mobile communication device including the steps of a) forming a plurality of recesses on a substrate, b) forming an insulation layer on the substrate, c) forming a plurality of filling-up layers for filling the recesses, d) forming a membrane on the filling-up layers and the substrate, e) forming a transmitting band pass filter including at least two FBARs and at least one inductor electrically connected to each other on an upper portion of the membrane, f) forming a receiving band pass filter including at least two FBARs and at least one inductor electrically connected to each other on an other upper portion of the membrane, g) forming a phase shifter including at least one inductor and a capacitor electrically connected with the transmitting and receiving band pass filter between the transmitting and receiving band pass filters on the membrane, and h) removing the filling-up layers.

Moreover, in order to achieve another object of the present invention, the present invention provides an FBAR band pass filter including a substrate, at least two FBARs formed on an upper portion of the substrate, and at least one inductor formed on the upper portion of the substrate and electrically connected with the FBARs. Cavities are provided between the FBARs and a side of the substrate respectively, each of the FBARs includes a separated lower electrode, a piezoelectric layer formed on the lower electrode, and an upper electrode formed on the piezoelectric layer, a first cavity is formed between a side of the lower electrode and the substrate, and a second cavity is formed between other side of the lower electrode and the substrate.

In addition, in order to achieve still another object of the present invention, the present invention provides a manufacturing method of an FBAR band pass filter including the steps of a) forming at least two recesses on an upper portion of a substrate, b) forming an insulation layer on the substrate, c) forming a filling-up layer for filling the recesses, d) forming a membrane on the filling-up layer and the insulation layer, e) forming at least two FBARs on an upper portion of the membrane, and f) forming at least one inductor adjacent to the FBARS and electrically connected to the FBARs on the membrane. The substrate includes one selected from a group of silicon, high resistance silicon, gallium-arsenic, glass, and ceramic, and the insulation layer comprises one selected from a group of silicon oxide, silicon nitride, zinc oxide, and aluminum nitride. The filling-up layer includes one selected from a group of polysilicon, phosphorus-silicate glass (PSG), zinc oxide, and polymer, and the membrane comprises low temperature oxide, silicon nitride, zinc oxide, and aluminum nitride.

The step e) includes 1) forming a first lower electrode on the upper portion of the membrane, 2) forming a piezoelectric layer on the lower electrode, 3) forming a first upper electrode on the piezoelectric layer, and 4) removing the filling-up layer.

According to the present invention, the FBAR band pass filter is an essential component for performing the function of extracting a specific frequency and removing a specific noise during reception of a high frequency of about 1 to 15 GHz and enhancing sound quality, is manufactured by means of a process for a semiconductor, and can be formed small in size less than $\frac{1}{10}$ to $\frac{1}{100}$ and light with in comparison with in comparison with a conventional surface acoustic wave (SAW) filter and a ceramic filter. Namely, since a transmitting and receiving band pass filters and an inductor can be easily integrated into one chip, a duplexer having a minimum size can be provided in response to the request for smallness and lightness of all sorts of mobile communication device. Moreover, the transmitting and receiving band pass filters can be realized in a remarkable small size in comparison to the conventional SAW band pass filter as well as has advantages of low insertion loss and low power consumption. Thus, an interface design and a terminal operating programming can be easily achieved, and a region of a board with a duplexer is mounted in a mobile communication device can be reduced to about 80%. Moreover, since a duplexer including a transmitting band pass filter and a receiving band pass filter according to the present invention can be easily manufactured on single substrate by using MEMS process, the manufacturing cost and time of the duplexer can be remarkably reduced.

BEST MODE FOR CARRYING OUT THE INVENTION

Although, hereinafter, an FBAR band pass filter according to the preferred embodiment of the present invention, a duplexer including the FBAR band pass filter, and the manufacturing processes thereof will be described with reference to the accompanying drawings, it will be appreciated by those skilled in the art that the present invention cannot be limit or restricted by these embodiments.

Figure 1:
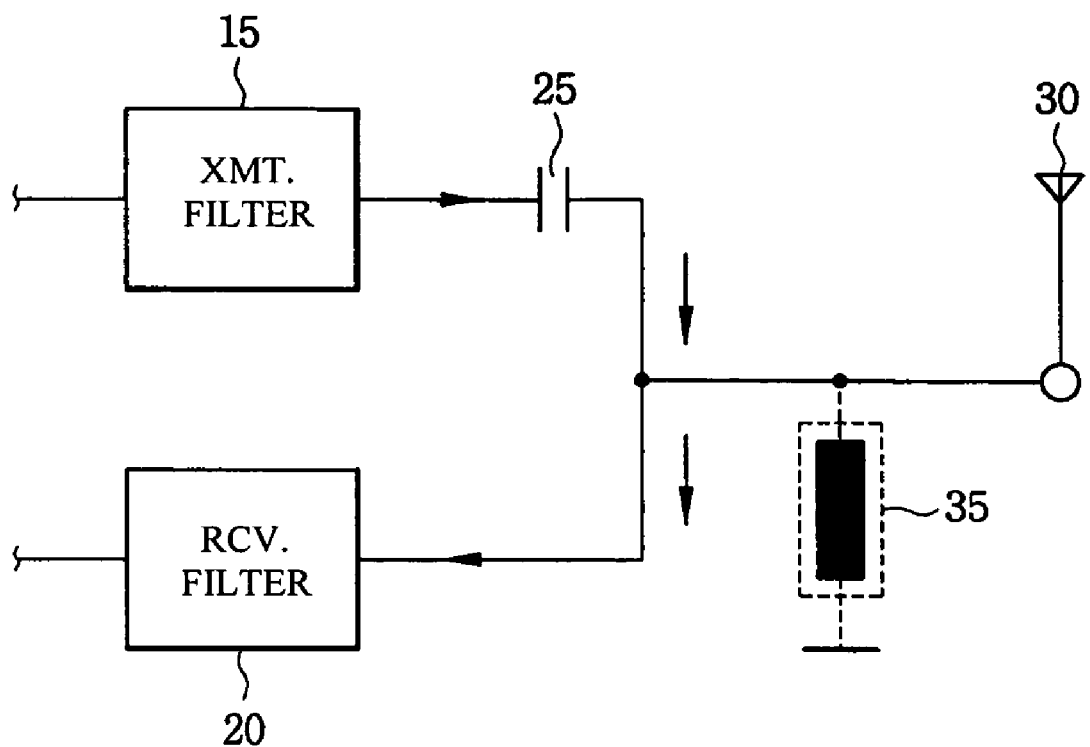
FIG. 1 is a schematic block diagram showing a conventional duplexer.
Figure 2:
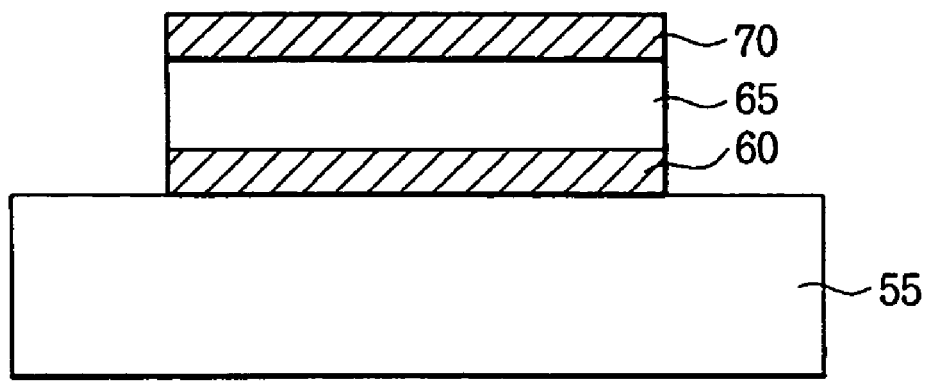
FIG. 2 is a schematic sectional view of a conventional FBAR filter.
Figure 3:
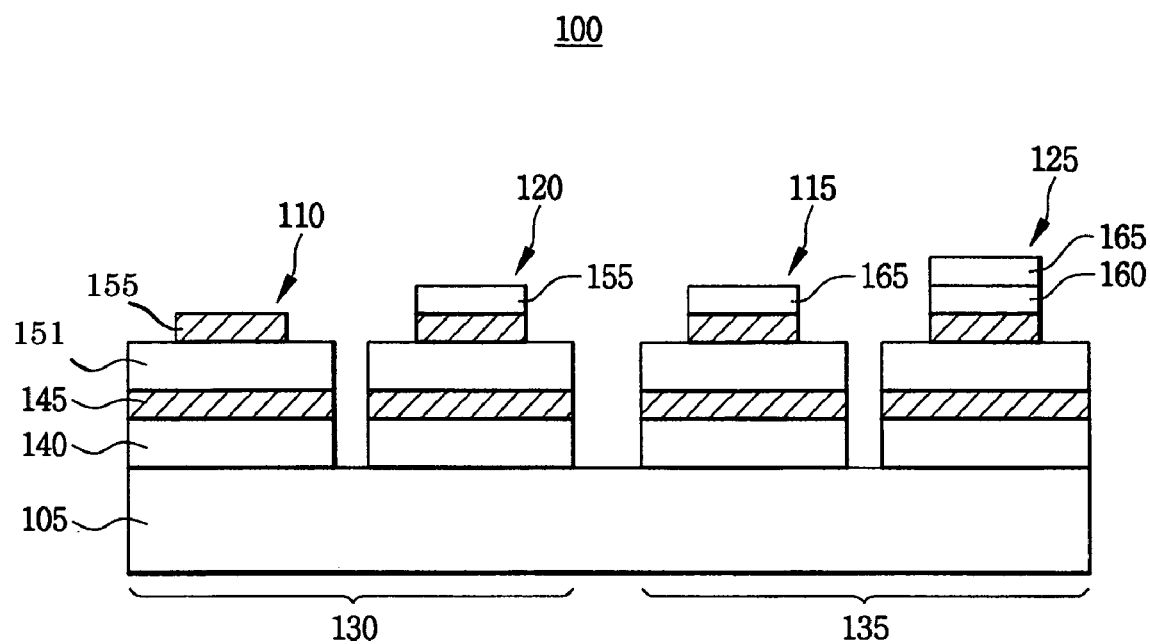
FIG. 3 is a sectional view of a conventional FBAR duplexer.
Figure 4:
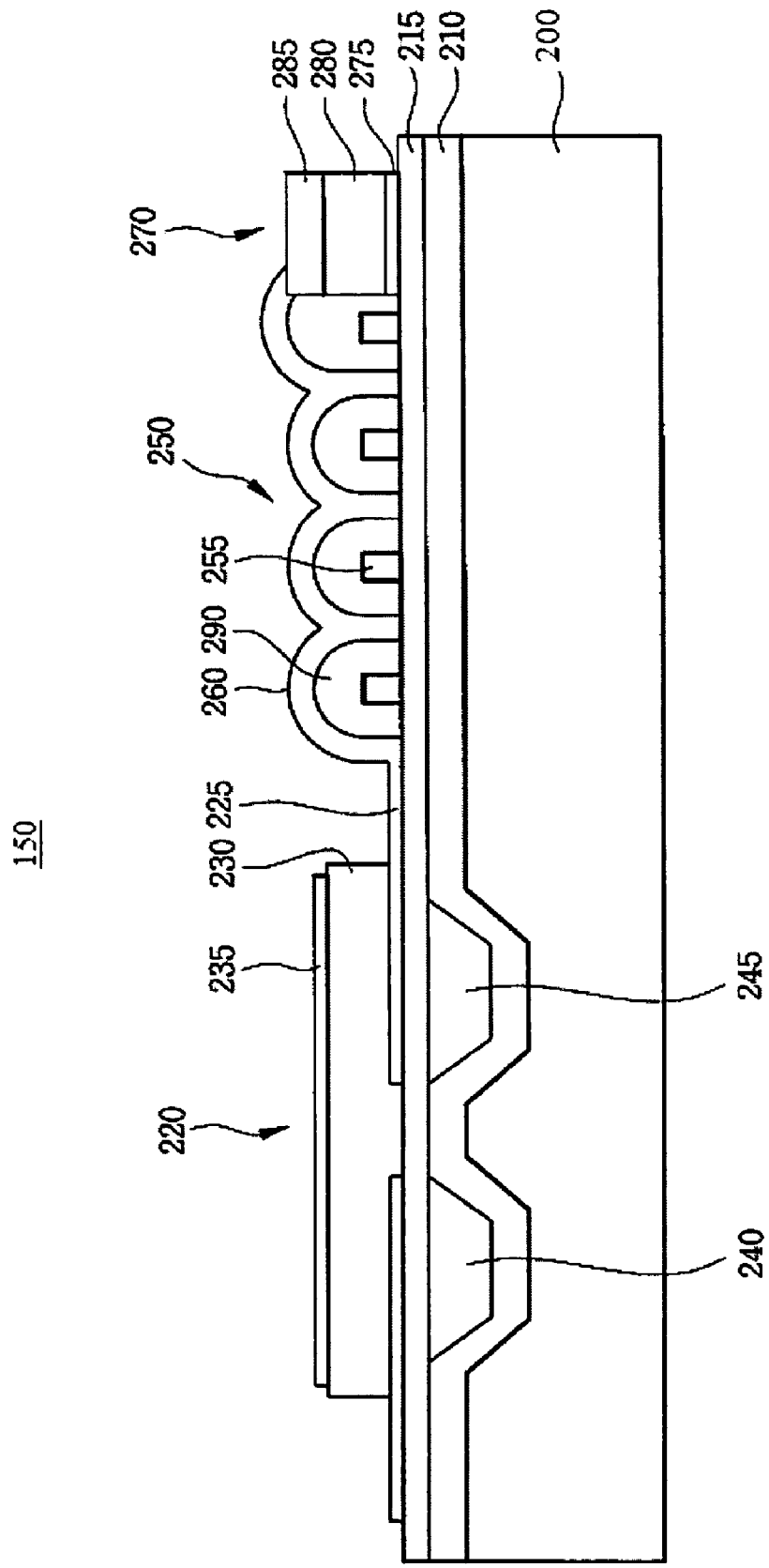
FIG. 4 is a sectional view illustrating a construction of a band pass filter including an FBAR according to an embodiment of the present invention.

FIG. 4 is a sectional view illustrating the construction of a band pass filter including an FBAR according to a preferred embodiment of the present invention;

With reference to FIG. 4, a transmitting or receiving FBAR band pass filter 150 according to the embodiment includes a substrate 200, an insulation layer 210 formed on the substrate 200, a membrane 215 formed on the insulation layer and over first and second cavities 240 and 245, an FBAR 220 formed on an upper portion of the membrane 215, and an inductor 250 formed on other upper portion of the membrane 215. Namely, according to the embodiment, the FBAR 220, the inductor 250, and a capacitor 270 are integrated into one body on the substrate 200.

The substrate 200 is comprised of silicon (Si), a high resistance silicon (HRS), a gallium-arsenic (Ga—As), a glass, or a ceramic, wherein the insulation layer 210 is comprised of a zinc oxide (ZnO), a silicon nitride ($Si_XN_Y$), or aluminum nitride (AlN).

On a lower portion of the FBAR 220 disposed on the upper side of the substrate 200, the first and second cavities 240 and 245 are formed with a predetermined dimension. The membrane 215, which is comprised of a silicon oxide, a zinc oxide, or a nitride such as a silicon nitride and aluminum nitride, is disposed over the first and second cavities 240 and 245 and on the upper side of the insulation layer 210.

The FBAR 220 is disposed on an upper portion of the membrane 215 on which the first and second cavities 240 and 245 are disposed. The FBAR 220 includes a first lower electrode 225 formed on the membrane 215, a piezoelectric layer 230 formed on the lower electrode 225, and an upper electrode 235 formed on a first upper portion of the piezoelectric layer 230.

The first lower electrode 225, comprised of a metal having a high electrical conductivity such as aluminum (Al), gold (Au), platinum (Pt), tungsten (W), molybdenum (Mo), tantalum (Ta), platinum-tantalum (Pt—Ta), titanium (Ti), or platinum-titanium (Pt—Ti), is separated into two portions around the first and second cavities 240 and 245, an end thereof is disposed on an upper side of the first and second cavities 240 and 245, and other end thereof is connected with the membrane 215.

The piezoelectric layer 230 comprised of aluminum nitride (AlN) or zinc oxide (ZnO) is formed on the lower electrode 225 with an area smaller than that of the lower electrode 225. The piezoelectric layer 230 generates a bulk acoustic wave when an electric field between the first lower electrode 225 and the first upper electrode 235 varied in time by applying a signal to the lower electrode 225.

The first upper electrode 235 is formed on the upper side of the piezoelectric layer 230 with an area smaller than that of the piezoelectric layer 230, and like the first lower electrode 225, is comprised of a metal with high electrical conductivity such as aluminum (Al), gold (Au), platinum (Pt), tungsten (W), molybdenum (Mo), tantalum (Ta), platinum-tantalum (Pt—Ta), titanium (Ti), or platinum-titanium (Pt—Ti).

The capacitor 270, disposed the other end portion of the membrane 215 to be adjacent to the inductor 250, includes a second lower electrode 275, a dielectric layer 280, and a second upper electrode 285. A metal electric wire 260, comprised of a metal with high electrical conductivity such as aluminum, platinum, tantalum, platinum-tantalum, titanium, or platinum-titanium, is extended from the capacitor 270 and is electrically connected with the first lower electrode 225 of the FBAR 220 via the inductor 250. The electric wire 260 is connected with a metal wire 255 of the inductor 250 in the form of inserting an air cap 290, and also can be connected with the inductor 250 in the form of being embedded in the substrate 200.

The transmitting or receiving FBAR band pass filter 150 includes at least two FBARs 220 or at least two FBARs 220 and at least one inductor 250. The FBAR band pass filter 150 may be comprised of only the FBAR 220 and proper damping can be obtained in a band for a transmitting terminal or a receiving terminal by adding the inductor 250. However, since the additional inductor 250 is not required when there is sufficient damping, the band pass filter 150 can be constructed with only the FBARs 220.

Hereinafter, the manufacturing method of the transmitting or receiving band pass filter 200 according to the embodiment of the present invention will be described in detail with reference to the accompanying drawings.

FIGS. 5A to 5I are sectional views illustrating the manufacturing process of the band pass filter shown in FIG. 4. In FIGS. 5A to 5G, same components in FIG. 4 are referred to same reference numerals.

Figure 5A:
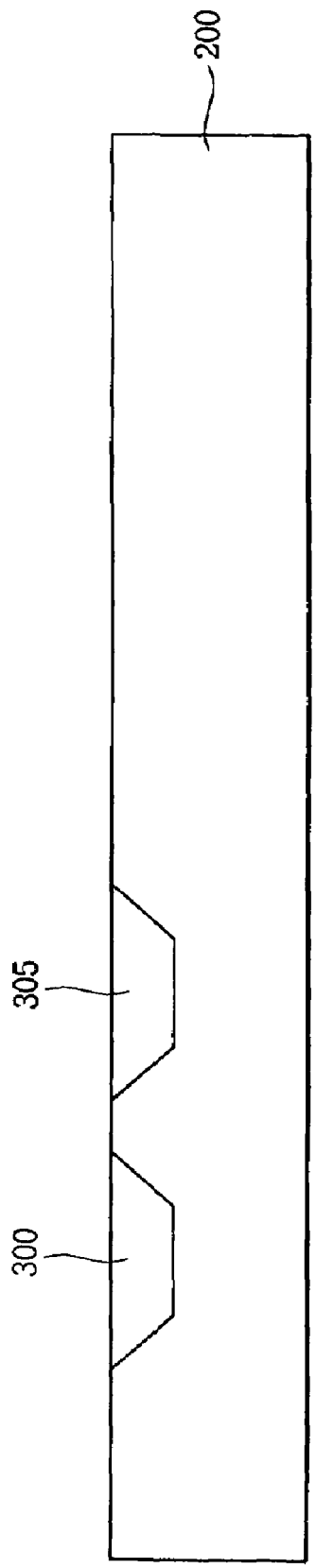
FIGS. 5A to 5I are sectional views illustrating manufacturing processes of the band pass filter in FIG. 4.

By referring FIG. 5A, first, the substrate 200, comprised of compound semiconductor such as a silicon, a high resistance silicon (HRS) wafer, a gallium-arsenic (Ga—As), or a glass or a ceramic, is provided, and the top portion of the substrate 200 is etched at a predetermined depth by using photolithography so that a first and second recesses 300 and 305 adjacent to each other are formed for forming the first and second cavities 240 and 245.

Figure 5B:
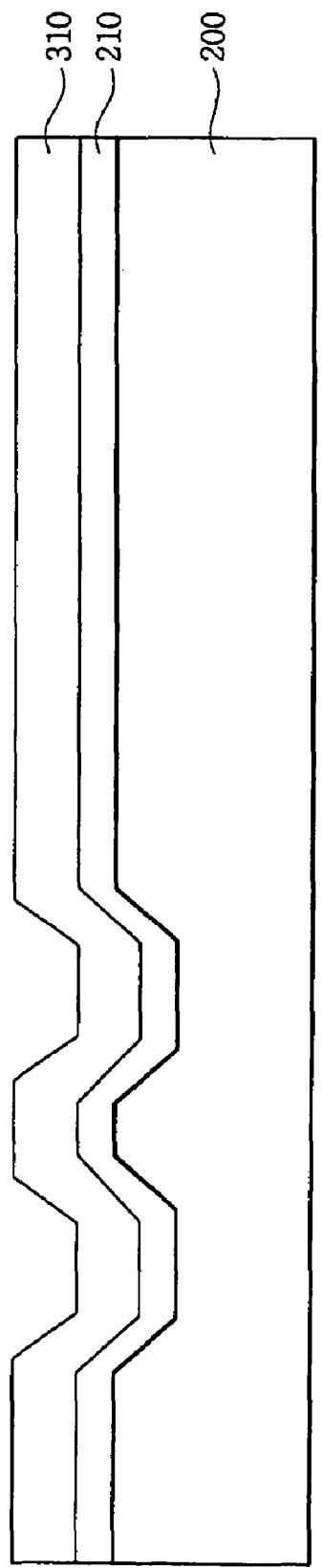

As shown in FIG. 5B, the insulation layer 210 is formed on the substrate 200 on which the first and second recesses 300 and 305 are formed, by disposing silicon oxide with about 1000 Å-10 μm by means of a chemical vapor disposing (CVD) technique. Moreover, the insulation layer 210 can be also formed by disposing the silicon nitride, zinc oxide, or aluminum nitride by means of a chemical vapor disposing technique, a plasma enhanced chemical vapor disposing (PECVD) technique, or a sputtering technique. At that time, since the insulation layer 210 is formed on the substrate 200 including the first and second recesses 300 and 305, the insulation layer 210 is formed with openings corresponding to the first and second recesses 300 and 305.

After that, in order for forming the first and second cavities 240 and 245 on the insulation layer 210, a sacrifice layer 310 is disposed at a thickness of about 1000 Å-10 μm. The sacrifice layer 310 is formed by disposing a poly-silicon, a phosphor-silicate glass (PSG), a zinc oxide, or a polymer by means of the chemical vapor disposing technique, the sputtering technique, or a spin coating technique. If the sacrifice layer 310 is formed with the phosphor-silicate glass, or the poly-silicon, the sacrifice layer 310 is formed by the chemical vapor disposing technique. Moreover, if the zinc oxide is used, the sacrifice layer 310 is formed by means of the sputtering technique, and if the sacrifice layer 310 is comprised of the polymer, the sacrifice layer 310 is formed by means of the spin coating technique.

Figure 5C:
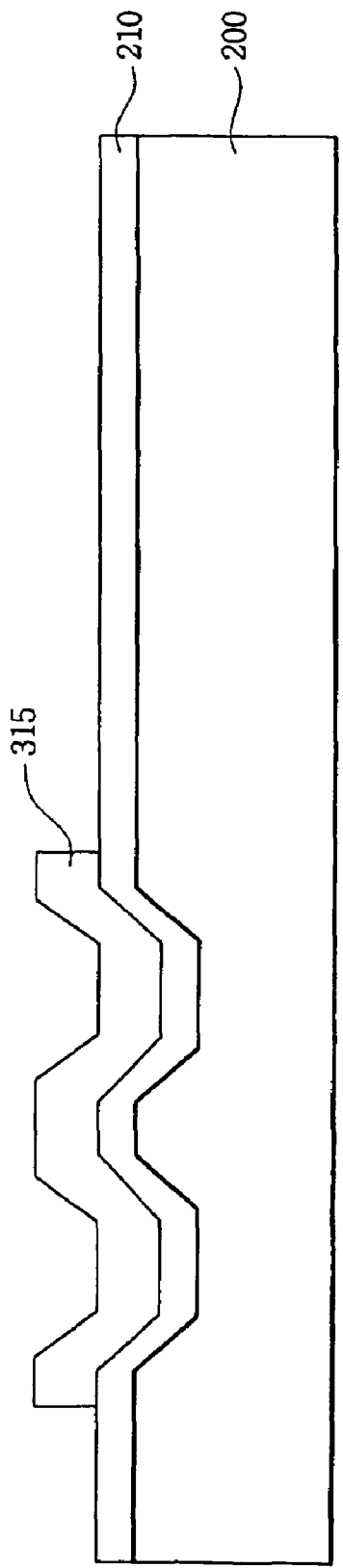

With reference to FIG. 5C, a sacrificing pattern 315 is formed on the insulation layer 210 around the first and second recesses 300 and 305 by patterning the sacrifice layer 310 so that it only remains on the upper portion of the first and second recesses 300 and 305 by using the photolithography technique. At that time, the sacrificing pattern 315 fills the openings corresponding to the first and second recesses 300 and 305 of the substrate 200.

Figure 5D:
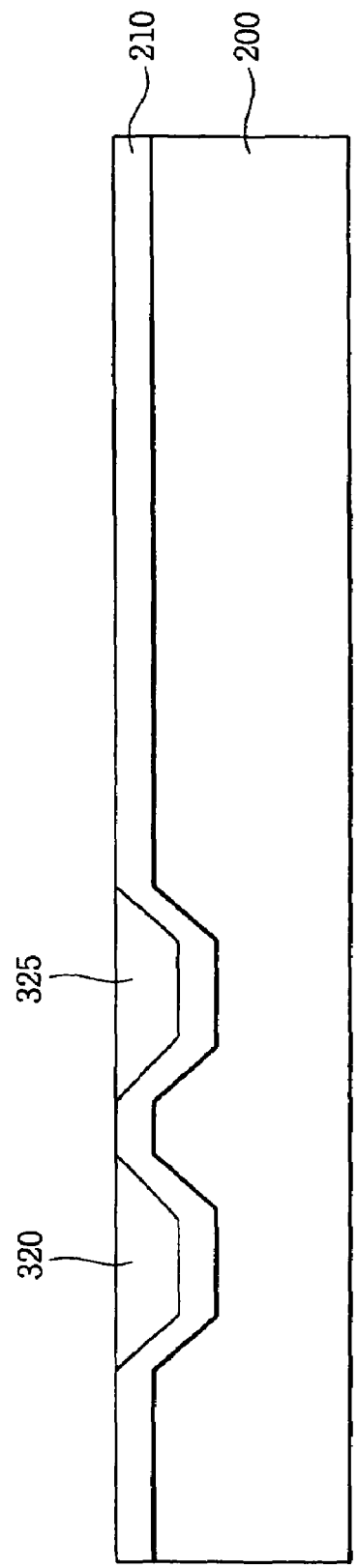

By referring FIG. 5d, by grinding the sacrificing pattern 315 by means of a chemical and mechanical polishing or etching the sacrificing pattern 315 by an etch back technique, a first and second filling-up layer 320 and 325 for filling the openings of the insulation layer 210. Thus, the first recess 300 is filled with the insulation layer 210 and the first filling-up layer 320, and the second recess 305 is filled with the insulation layer 210 and the second filling-up layer 325. After the first and second filling-up layers 320 and 325 are removed, the first and second cavities 240 and 245 are formed.

Figure 5E:
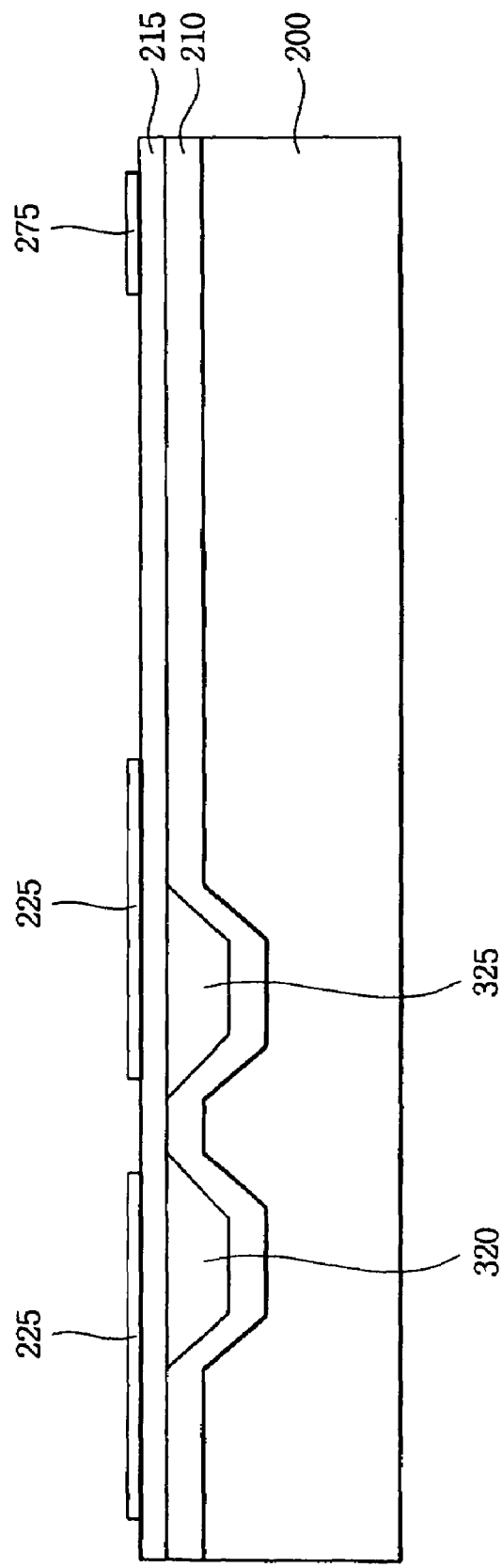

With reference to FIG. 5E, the membrane 215 and a first metal layer (not shown) are formed on the first and second filling-up layers 320 and 325, and the insulation layer 210 in turn.

The membrane 215 is formed at a thickness of about 1000 Å-10 μm by disposing the silicon oxide, the silicon nitride, the zinc oxide, or the aluminum nitride by means of a low pressure chemical phase disposing technique, the plasma enhanced chemical vapor disposing technique, the plasma chemical phase disposing technique, or the sputtering technique. If the membrane 215 is comprised of the silicon oxide or the silicon nitride, the membrane 215 is formed by means of the low pressure chemical phase disposing technique or the plasma enhanced chemical phase disposing technique, and if the membrane 215 is comprised of the zinc oxide or the aluminum nitride, the membrane 215 is formed by means of the sputtering.

The first metal layer is formed at a thickness of about 1000 Å-10 μm by disposing a metal of high electrical conductivity such as aluminum, gold, platinum, tungsten, molybdenum, platinum-tantalum, or platinum-titanium by means of the sputtering or a vacuum vapor disposing technique.

Next, by patterning the first metal layer by means of the photolithography process, the first lower electrode 225 is formed on an upper portion of the membrane 215 while the second lower electrode 275 is formed on another upper portion of the membrane 215. The first lower electrode 225 is separated into two parts above the first and second filling-up layers 320 and 325. Namely, a part of the first electrode 225 is formed on the membrane 215 where the first filling-up layer 320 is located, and the rest of the first lower electrode 225 is formed on the membrane 215 where the second filling-up layer 325 is located. The part and the rest of the first lower electrode 225 are separated from each other at a predetermined gap.

Meanwhile, the second lower electrode 275 is formed on another upper portion of the membrane 215. In this case, since the metal wire 255 of the inductor 250 is formed between the first and second lower electrodes 225 and 275 subsequently, the first and second lower electrodes 225 and 275 are separated at a predetermined gap by considering a width of the metal wire 255. The first lower electrode 225 serves as a lower electrode of the FBAR 220, and the second lower electrode 275 serves as a lower electrode of the capacitor.

Figure 5F:
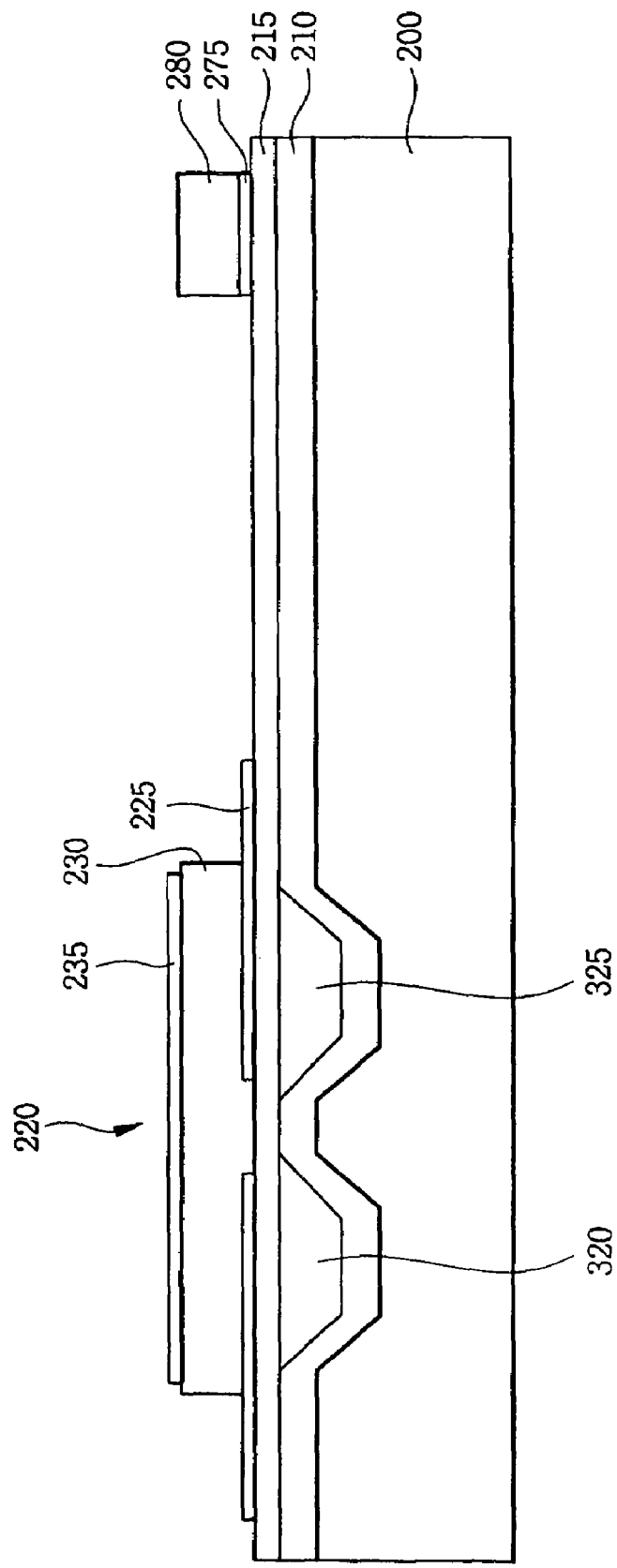

By referring FIG. 5F, on the membrane 215 on which the first and second lower electrodes 225 and 275 are formed, a piezoelectric material such as PZT, PLZT, PMN-PT, PZN, PZN-PT, the aluminum nitride, or zinc oxide is disposed at a thickness of about 1000 Å-10 μm by means of the chemical phase vapor disposing technique, a sol-gel technique, the sputtering technique, or the spin coating technique.

Next, the piezoelectric layer 230 of the FBAR 220 is formed on the first lower electrode 225 by patterning the piezoelectric material by means of the photolithography process, and, at the same time, the dielectric layer 280 of the capacitor 270 is formed on the second lower electrode 275. In this case, a phase change of the piezoelectric material forming the piezoelectric layer 230, the piezoelectric layer 230 may be heat-treated by means of a rapid thermal annealing (RTA).

Successively, a second metal layer (not shown) is formed at a thickness of about 1000 Å-10 μm by disposing the same metal such as aluminum, gold, platinum, tungsten, molybdenum, tantalum, platinum-tantalum, titanium, or platinum-titanium by means of the sputtering technique or the vacuum vapor disposing technique, then the first upper electrode 235 of the FBAR 220 is formed by patterning the second metal layer. Thus, the FBAR 220 including the first lower electrode 225, the piezoelectric layer 230 and the first upper electrode 235 is completed.

Figure 5G:
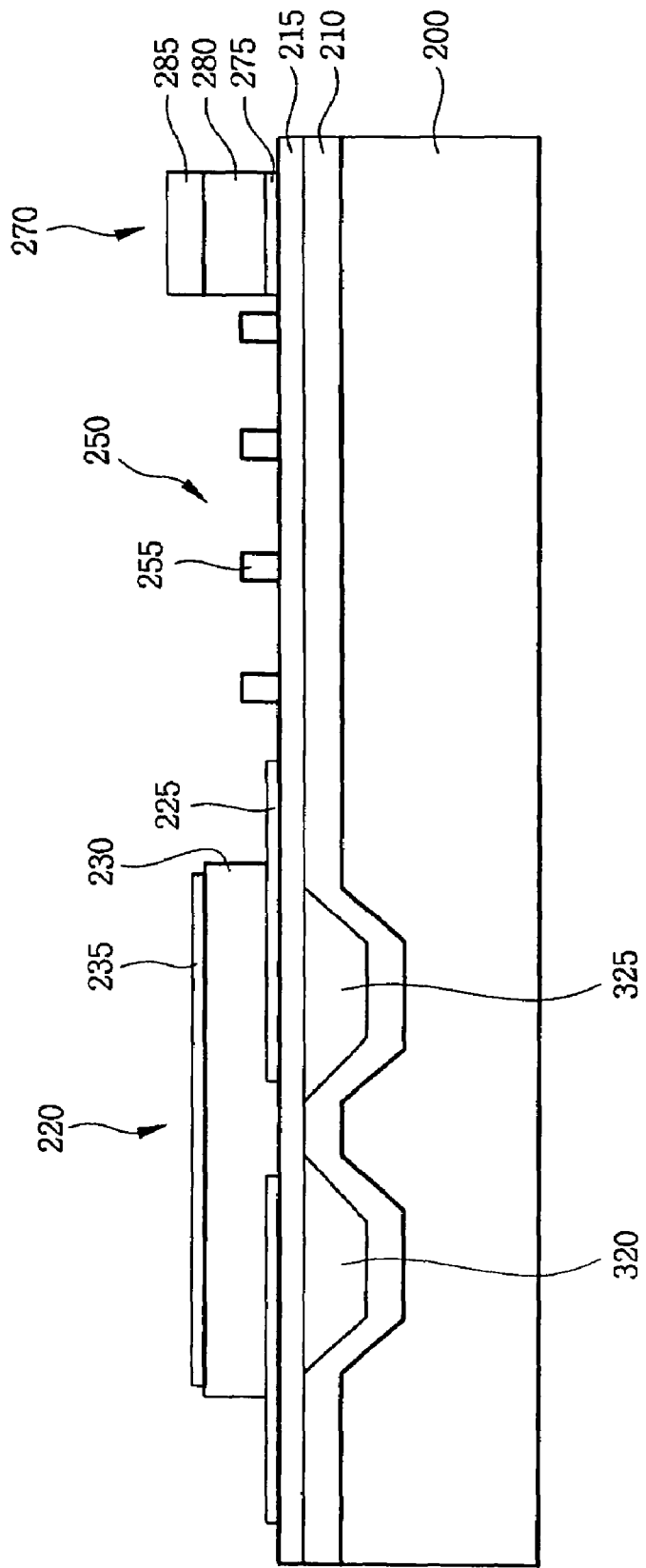

With reference to FIG. 5G, the metal wire 255 is formed on the membrane 215 between the FBAR 220 and the second lower electrode 275 by means of an electroplating technique, and the second upper electrode 285 is formed on the dielectric layer 280 at the same time. The metal wire 255 and the second upper electrode 285 are comprised of a metal such as aluminum, gold, platinum, tungsten, molybdenum, tantalum, platinum-tantalum, titanium, or platinum-titanium and formed at a thickness of about 1000 Å-10 μm. In this case, the second upper electrode 285 of the capacitor 270 is formed at a thickness thicker than that the first upper electrode of the FBAR 220. By doing so, the inductor 250 having the metal wire 255 and the capacitor having the second lower electrode 275, the dielectric layer 280 and the second upper electrode 285 are formed at a same time. According to the embodiment, the second upper electrode 285 of the capacitor 270 is formed simultaneously with the metal wire 255 of the inductor 250 in separation from the first upper electrode 235 of the FBAR 220. In this embodiment, since the second upper electrode 285 of the capacitor 270 is formed to have a thickness thicker than that of the first upper electrode 235 of the FBAR 220, the second upper electrode 285 can serve as a usual capacitor 270 by intercepting the resonance of the piezoelectric layer 230.

Figure 5H:
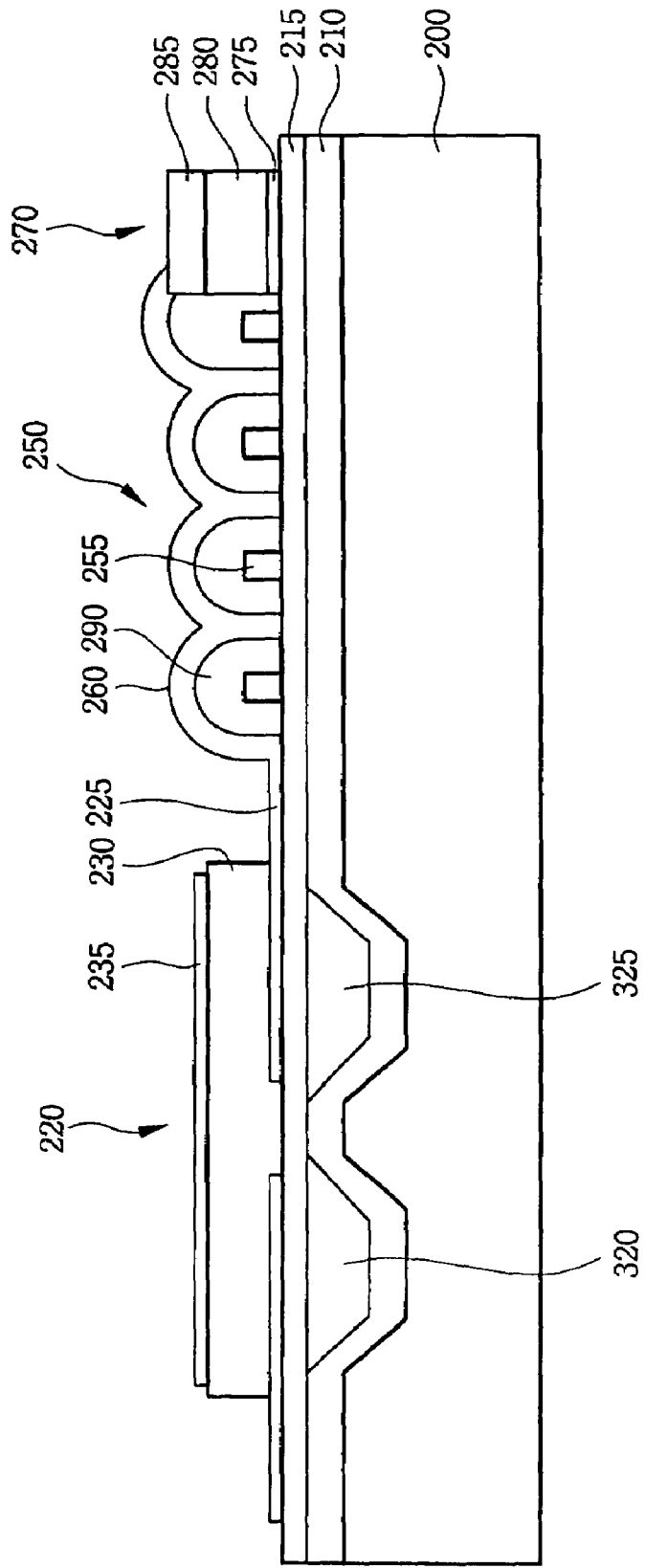

By referring FIG. 5H, a photo-resist layer is coated on the membrane 215 on which the inductor 250 is formed, then a photo-resist pattern (not shown) for partially exposing the second upper electrode 285 of the capacitor 270, the metal wire 255 of the inductor 250, and the first lower electrode 225 is formed by patterning the coated photo-resist layer.

Next, a third metal layer (not shown) comprised of a metal such as aluminum, gold, platinum, tungsten, molybdenum, tantalum, platinum-tantalum, or platinum-titanium is formed on the second upper electrode 285 of the exposed capacitor 270, the metal wire 255 of the inductor 250, the first lower electrode 225 of the FBAR 220, and the photo-resist pattern at a thickness of about 1000 Å-10 μm by means of the sputtering technique or the vacuum vapor disposing technique.

Then, by patterning the disposed third metal layer by means of the photolithography process, the connecting wire 260 for connecting the second upper electrode 285 of the exposed capacitor 270, the metal wire 255 of the inductor 250, and the first lower electrode 225 of the FBAR 220 to each other, and the photo-resist pattern is removed, then the connecting wire is formed on the upper portion of the inductor 250 in the form of an air bridge or an embedded type. At that time, the photo-resist pattern is removed, an air gap 290 is formed on the position of the photo-resist pattern. Thus, the capacitor 270 of a phase shifter, the inductor 250, and the FBAR 220 are electrically connected via the connecting wire 260.

Figure 5I:
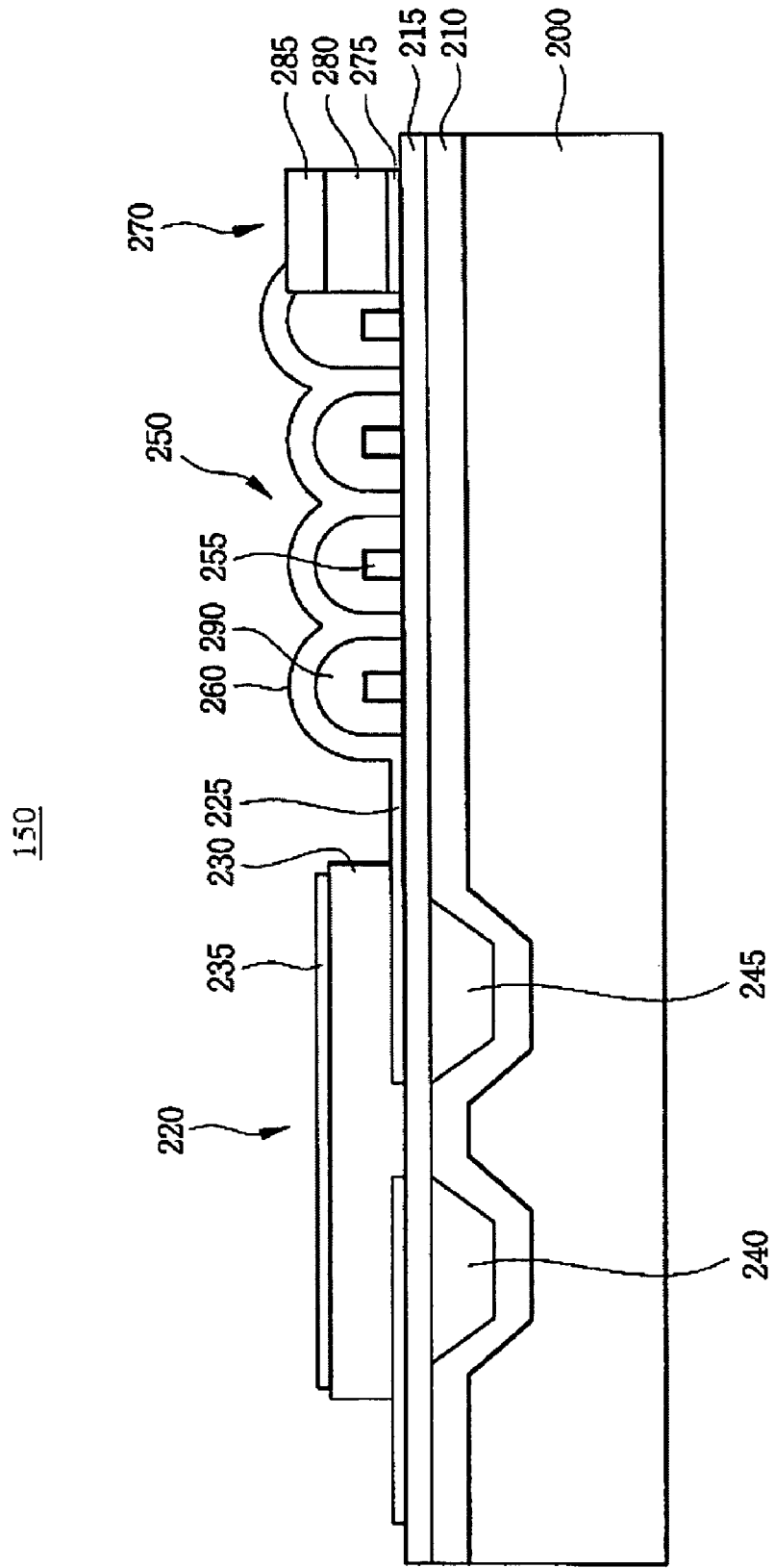

With reference to FIG. 5I, the transmitting or receiving band pass filter 150 including the FBAR 220, the inductor 250, and the capacitor 270 is completed by removing the first and second filling-up layers 320 and 325 and forming the first and second cavities 240 and 245 under the FBAR 220. In this case, if the first and second filling-up layer 320 and 325 are comprised of the polysilicon, it is removed by using a xenon fluoride (XeF$_2$) or brome fluoride (BrF$_2$), and if the first and second filling-up layers 320 and 325 are comprised of phosphorus-silicate glass or zinc oxide, it is removed by using buffered oxide etchant (BOE) or hydrogen fluoride. Moreover, if the first and second filling-up layers 320 and 325 are comprised of polymer, it is removed by using an ashing process or an organic solution including acetone.

Figure 6:
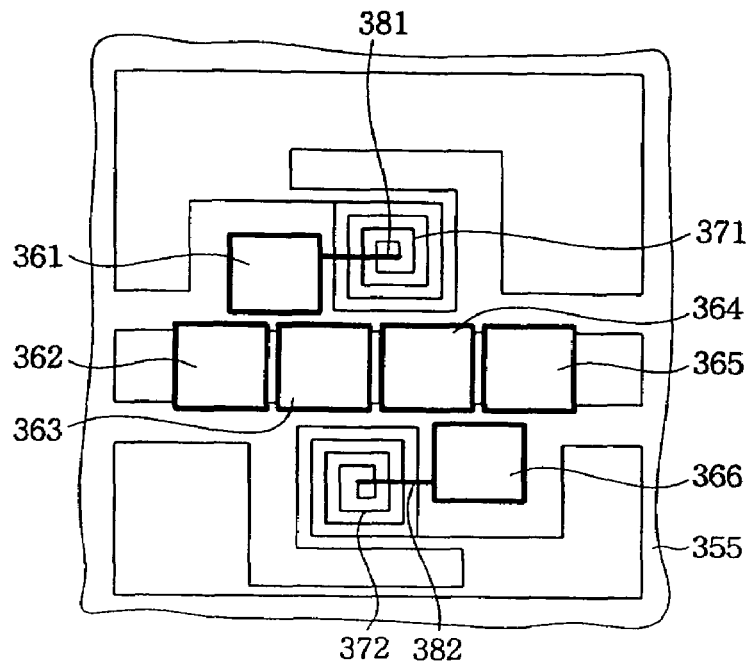
FIG. 6 is a plan view of a transmitting band pass filter including a plurality of FBAR and inductors according to other embodiment of the present invention.

FIG. 6 shows a plan view of the transmitting band pass filter including a plurality of FBARs and inductors according to other embodiment of the present invention.

With reference to FIG. 6, the transmitting band pass filter of a duplexer according to this embodiment of the present invention includes a first to sixth FBARs 361, 362, 363, 364, 365, and 366 formed on the substrate 355 and electrically connected to each other, and a first and second inductors 371 and 372. Namely, according to this embodiment, by connecting a plurality of FBARs each other, one transmitting band pass filter 350 is constructed. The first to sixth FBARs 361, 362, 363, 364, 365, and 366 are electrically connected to each other by a way that lower electrodes thereof are contacted to each other, or separation wires formed between the first to sixth FBARs 361, 362, 363, 364, 365, and 366, respectively.

According to the present invention, the transmitting or receiving band pass filter of the duplexer can be constructed with two FBARs basically. For example, if one connection of one serial FBAR with one shunt FBAR can construct a band pass filter. In this case, the serial FBAR and the shunt FBAR should have resonance frequencies different from each other. The difference of the resonance frequency between these FBARs appears in the frequency band of the band pass filter. In other words, the band pass filter can be constructed by combining two FBARs basically, as well as by combining more FBARs in several combinations according to a condition required by a mobile communication device in which a duplexer including these band pass filters is installed.

With reference to FIG. 6 again, the first FBAR 361 is electrically connected with the first inductor 371 through a first metal wire 381, and a second metal wire 382 electrically connects the sixth FBAR 366 with the second inductor 372. The first and second inductors 371, and 372 serve a function for increasing damping in a frequency band width required according to the mobile communication device because the damping of the transmitting band pass filter 350 is remarkably small in a receiving frequency band width of the duplexer.

According to this embodiment, since the method for manufacturing the transmitting band pass filter 350 including the first to sixth FBARs 361, 362, 363, 364, 365, and 366 and the first and second inductors 371 and 372 is the same as the manufacturing process of the band pass filter according to FIGS. 5A to 5I except for the patterning in the photolithography process, the description for the manufacturing method will be omitted.

Figure 7:
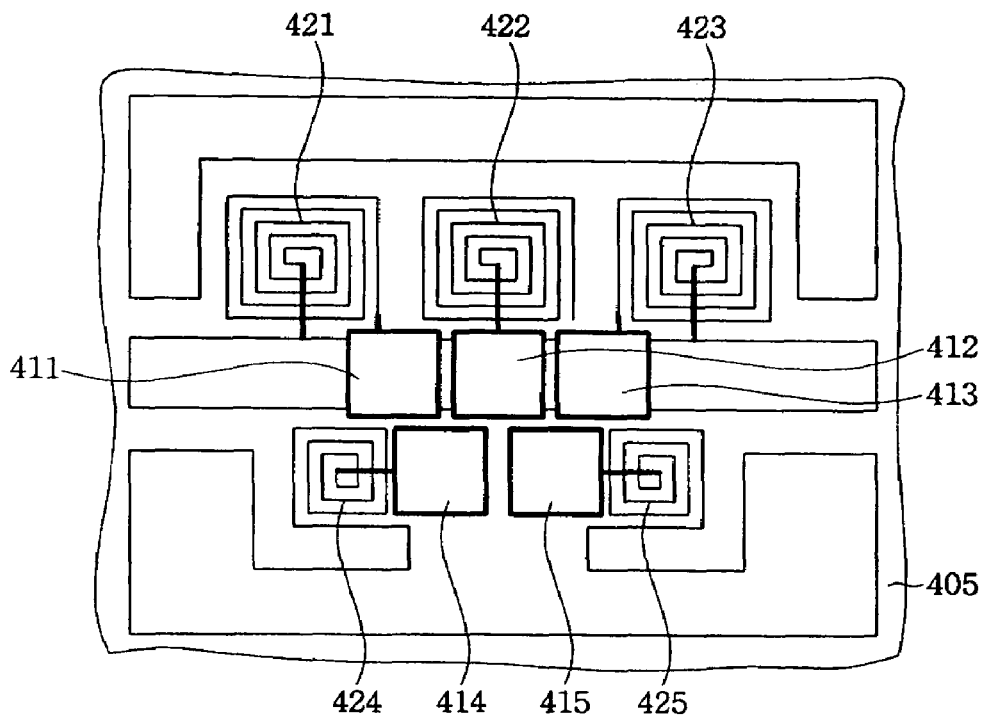
FIG. 7 is a plan view of a receiving band pass filter including a plurality of FBAR and inductors according to another embodiment of the present invention.

FIG. 7 shows a plan view of a receiving band pass filter including a plurality of FBARs and inductors according to still another embodiment of the present invention.

With reference to FIG. 7, a receiving band pass filter 400 of a duplexer according to this embodiment includes a first to fifth FBARs 411, 412, 413, 414, and 415, and a first to fifth inductors 421, 422, 423, 424, and 425 formed on a substrate 405 and electrically connected to each other. The first to fifth FBARs 411, 412, 413, 414, and 415 are electrically connected to each other through a first to fifth metal wires 431, 432, 433, 434, and 435.

Figure 8:
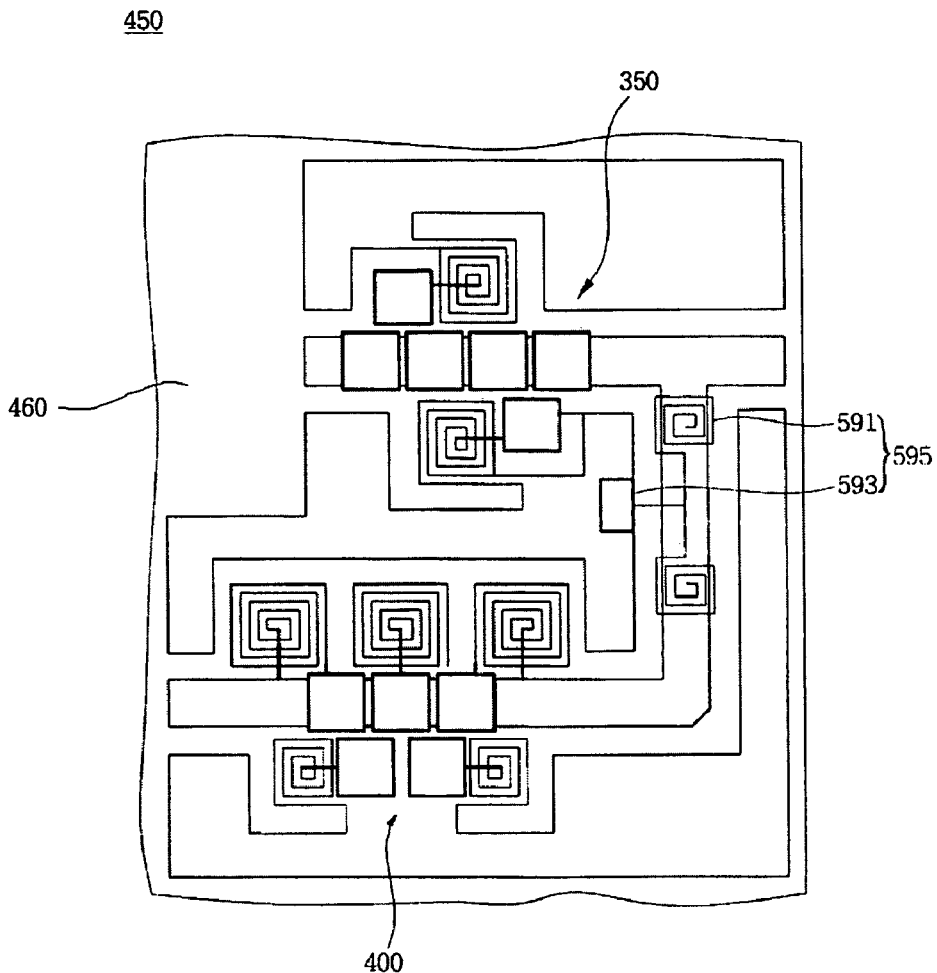
FIG. 8 is a plan view of a duplexer constructed with a transmitting band pass filter and a receiving band pass filter in FIGS. 6 and 7 according to still another embodiment of the present invention.

FIG. 8 is a plan view of a duplexer constructed with the transmitting and receiving band pass filters shown in FIGS. 6 and 7. As shown in FIG. 8, same components in FIGS. 6 and 7 are referred to same reference numerals.

According to the present invention, the duplexer 450 is constructed with two more band pass filters 350. These transmitting and receiving FBAR band pass filters 350 are connected with an antenna to construct the duplexer. In order to connect the transmitting and receiving band pass filter to the antenna, it is required a phase shifter 595 including an inductor and a capacitor. At that time, the phase shifter 595 serves to remove interference between a band pass filter of a transmitting terminal and a band pass filter of a receiving terminal. In general, the phase shifter 595 can be constructed by using a λ/4 transmitting line or an LC circuit. However, in a case of the λ/4 transmitting line, since the length of the line is too long, for the miniaturization of device, the phase shifter 595 of the present invention is constructed by using the LC circuit comprised of an inductor 591 and a capacitor 593.

With reference to FIG. 8, the duplexer 450 is constructed with a transmitting band pass filter 350 formed on the upper portion of the substrate 460 and a receiving band pass filter 400 formed on other upper portion of the substrate 460. The transmitting band pass filter 350 includes the first to sixth FBARs 361, 362, 363, 364, 365, and 366, and the first to second inductors 371 and 372 formed on the substrate 460 and electrically connected to each other, and the receiving band pass filter 400 includes the first to fifth FBARs 411, 412, 413, 414, and 415 and the first to fifth inductors 421, 422, 423, 424, and 425 formed on the substrate 405 and electrically connected to each other.

According to the present invention, in order to construct the duplexer 450, it is required at least four FBARs having different resonance frequencies. The loading effect is used in the present invention each FBAR constructing the duplexer 450 to have a resonance frequency different from each other. This loading effect is obtained by varying the inductance in an equivalent circuit of an R-L-C, then the resonance frequency of a resonator of single FBAR. At that time, since the inductance varies according to mass of the FBAR, a metal having a good electric conductivity can be formed on the substrate 460 by adjusting the inductance by means of a light-off technique or an electric plating technique.

Figure 9:
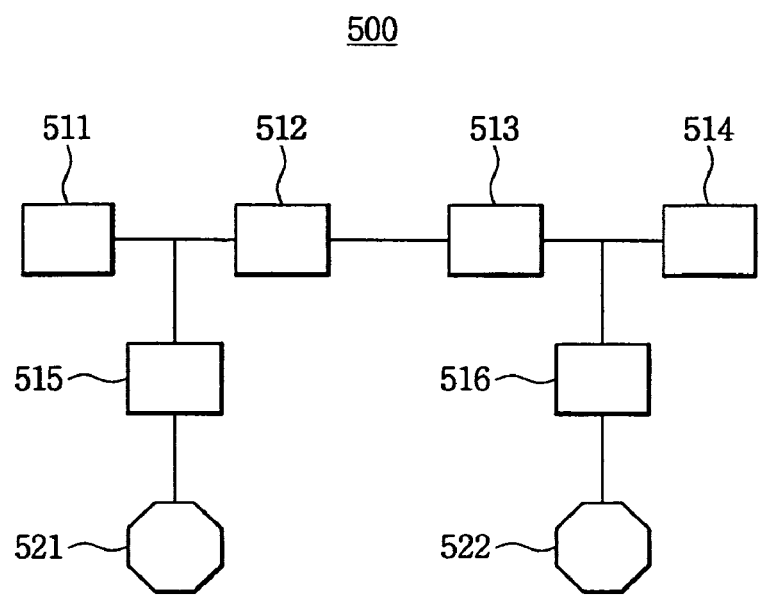
FIGS. 9 and 10 are schematic view illustrating constructions of a transmitting band pass filter and a receiving band pass filter according to the present invention respectively.
Figure 10:
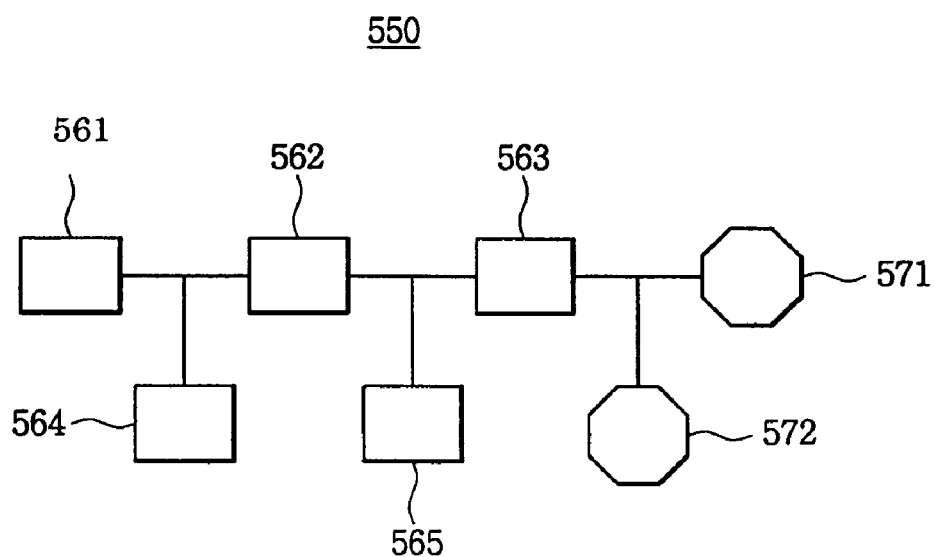

FIGS. 9 and 10 are schematic views illustrating the construction of a transmitting and receiving band pass filter according to still another embodiment of the present invention.

With reference to FIGS. 9 and 10, the transmitting band pass filter 500 includes a first to fourth FBARs 511, 512, 513, and 514 disposed on a substrate in parallel to each other, a fifth FBAR 515 disposed between the first and second FBARs 511 and 512 in a direction orthogonal to the first and second FBARs 511 and 512, a sixth FBAR 516 disposed between the third and fourth FBARs 513 and 514 in an orthogonal direction, a first inductor 521 formed adjacent to the fifth FBAR 515, and a second inductor 522 disposed adjacent to the sixth FBAR 516. At that time, the first to sixth FBARs 511, 512, 513, 514, 515, and 516 are electrically connected to each other, and the first and second inductors 521, and 522 are electrically connected to each other through metal wires.

Meanwhile the receiving band pass filter 550 includes a first to third FBARs 561, 562, and 563 disposed on a substrate in parallel to each other, a fourth FBAR 564 disposed between the first and second FBARs 561 and 562 in an orthogonal direction, a fifth FBAR 565 disposed between the second and third FBARs 562 and 562 in an orthogonal direction, and a first and second inductors 571 and 572 disposed adjacent to the third FBAR 563. The first to fifth FBARs 561, 562, 563, 564, and 565 are electrically connected to each other, and the first and second inductors 571 and 572, and the third FBAR 563 are electrically connected to each other through metal wires.

Figure 11:
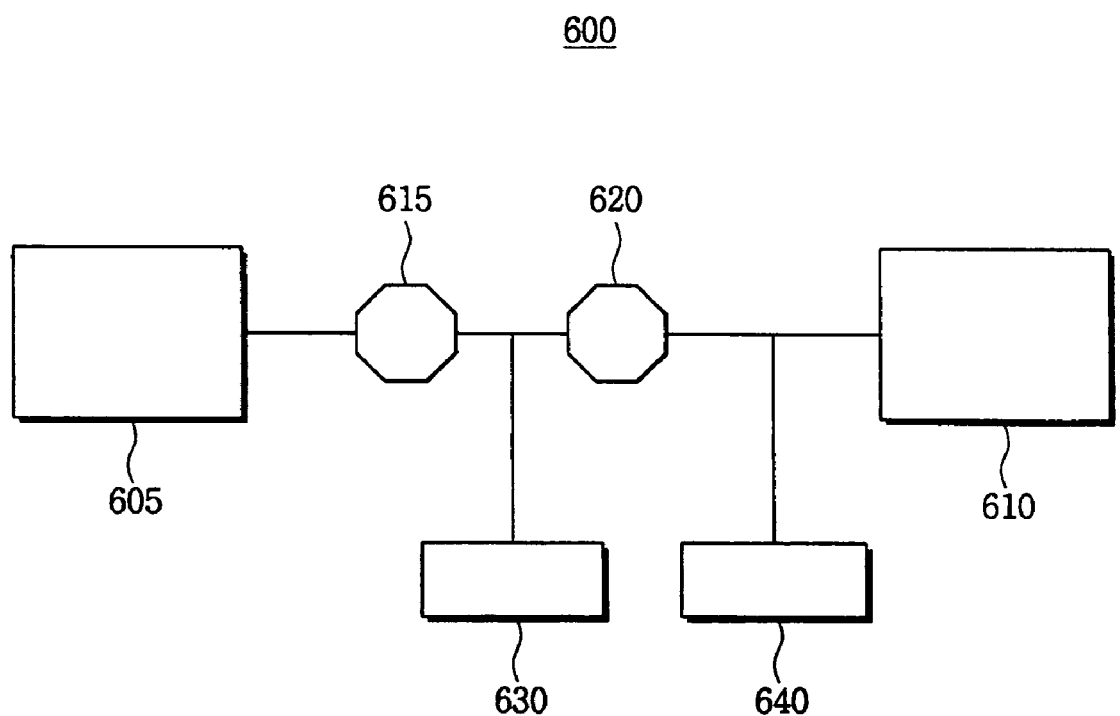
FIG. 11 is a schematic view illustrating a construction of a duplexer according to still another embodiment of the present invention.

FIG. 11 is a schematic view illustrating the construction of a duplexer according to still another embodiment of the present invention.

As shown in FIG. 11, a duplexer 600 according to the embodiment includes transmitting and receiving band pass filter 605 and 610 separated at a predetermined gap, a first and second inductors 615 and 620 formed between the transmitting and receiving FBAR band pass filter 605 and 610, a capacitor 630 connected between the first and second inductors 615 and 620, and an antenna 640 disposes adjacent one of the transmitting and receiving FBAR band pass filters 605 and 610. In the manufacturing method of the duplexer shown in FIG. 11, since the manufacturing method of the duplexer according to this embodiment is basically identical with the manufacturing method shown in FIGS. 5A to 5I except for the process of patterning the recesses, various metal layers, and the piezoelectric layers into several parts, its description will be omitted.

According to the present invention, since the transmitting and receiving band pass filter and the inductor can be integrated into one chip, a duplexer with minimized size can be provided in response to the request of miniaturization and lightness of various mobile communication device.

Moreover, since the transmitting or receiving band pass filter according to the present invention can be embodied in a remarkable size in comparison with the conventional SAW band pass filter as well as has a low insertion loss and low power consumption. Thus, an interface design and a terminal operating programming can be easily achieved, and a region of a board with a duplexer is mounted in a mobile communication device can be reduced to about 80%.

Moreover, since a duplexer including a transmitting band pass filter and a receiving band pass filter according to the present invention can be easily manufactured on single substrate by using MEMS process, the manufacturing cost and time of the duplexer can be remarkably reduced.

Although the preferred embodiments of the present invention have been shown and described, it will be appreciated by those skilled in the art that changes may be made in these embodiments without departing from the principles and spirit of the invention, scope of which is defined in the claims and their equivalents.

The invention claimed is:

1. A duplexer of a mobile communication device comprising:
    a transmitting band pass filter, formed on an upper portion of a substrate, having at least two FBARs (Film Bulk Acoustic Resonators) electrically connected to each other;
    a receiving band pass filter, formed on the upper portion of the substrate, having at least two FBARs electrically connected to each other; and
    a phase shifter electrically connected with the transmitting band pass filter and the receiving band pass filter, the phase shifter comprising an inductor electrically connected to the FBARs of the transmitting and receiving band pass filters and a capacitor disposed adjacent the inductor, the capacitor having an upper electrode,
    wherein the FBARs have upper electrodes that are thinner than the upper electrode of the capacitor.

2. The duplexer as claimed in claim 1, wherein each of the transmitting and receiving band pass filters further comprises at least one inductor electrically connected to at least one of the at least two FBARs.

3. The duplexer as claimed in claim 1, wherein each of the FBARs further comprises a lower electrode and, a piezoelectric layer, wherein the lower electrode and the upper electrode of each FBAR comprise a material selected from the group consisting of aluminum, gold, platinum, tungsten, molybdenum, tantalum, platinum-tantalum, titanium, and platinum-titanium, and wherein the piezoelectric layer of each FBAR comprises a material selected from the group consisting of PZT (lead zirconium titanate), PLZT (lanthanum-doped lead zirconium titanate), PMN (magnesium-lead niobate), PMN-PT (lead-magnesium-niobate lead titanate), PZN (lead zinc niobate), PZN-PT (lead zinc niobate-lead titanate), aluminum nitride, and zinc oxide.

4. The duplexer as claimed in claim 1, wherein the capacitor further comprises a lower electrode and a dielectric layer, and
    further comprising a connecting wire for connecting the capacitor, the inductor, and the FBARs.

* * * * *